United States Patent
Tamura et al.

(10) Patent No.: US 7,290,225 B2
(45) Date of Patent: Oct. 30, 2007

(54) METHOD FOR COMPRESSING SEMICONDUCTOR INTEGRATED CIRCUIT, USING DESIGN REGION DIVIDED INTO PLURAL BLOCKS

(75) Inventors: Naoyuki Tamura, Kawasaki (JP); Takayuki Kamei, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 828 days.

(21) Appl. No.: 10/678,166

(22) Filed: Oct. 6, 2003

(65) Prior Publication Data

US 2005/0015735 A1 Jan. 20, 2005

(30) Foreign Application Priority Data

Jul. 18, 2003 (JP) ............................. 2003-199140

(51) Int. Cl.
*G07F 17/50* (2006.01)

(52) U.S. Cl. ................... 716/2; 716/7; 716/8; 716/11; 716/12

(58) Field of Classification Search ................. 716/2, 716/7, 8–15

See application file for complete search history.

(56) References Cited

U.S. PATENT DOCUMENTS 5,612,893 A * 3/1997 Hao et al. ..................... 716/2
7,155,697 B2 * 12/2006 Teig et al. ................... 716/13

OTHER PUBLICATIONS

"Fabrix Preliminary Datasheet", AmmoCore Technology, Inc., 2002, 4 Pages.

* cited by examiner

*Primary Examiner*—Vuthe Siek
(74) *Attorney, Agent, or Firm*—Oblon, Spivak, McClelland, Maier & Neustadt, P.C.

(57) ABSTRACT

A method for compressing a semiconductor integrated circuit, comprising dividing a design region, in which a semiconductor integrated circuit is to be designed, into a plurality of blocks, assigning semiconductor devices to each of the blocks, determining a device density of each block, compressing any block, and connecting the blocks by wiring. In the compressing of the block, the block that is determined to have a low device density is compressed.

19 Claims, 15 Drawing Sheets

FIG. 6

| BLK00 | BLK01 | BLK02 | BLK03 | BLK04 |
| BLK10 | BLK11 | BLK12 | BLK13 | BLK14 |
| BLK20 | BLK21 | BLK22 | BLK23 | BLK24 |
| BLK30 | BLK31 | BLK32 | BLK33 | BLK34 |
| BLK40 | BLK41 | BLK42 | BLK43 | BLK44 |

FIG. 7

| BLK00 | BLK01 | BLK02 | BLK03 | BLK04 |
| BLK10 | BLK11 | BLK12 | BLK13 | BLK14 |
| BLK20 | BLK21 | BLK22 | BLK23 | BLK24 |
| BLK30 | BLK31 | BLK32 | BLK33 | BLK34 |
| BLK40 | BLK41 | BLK42 | BLK43 | BLK44 |

| BLK00 | BLK01 | BLK02 | BLK03 | BLK04 |
|---|---|---|---|---|
| BLK10 | BLK11 | BLK12 | BLK13 | BLK14 |
| BLK20 | BLK21 | BLK22 | BLK23 | BLK24 |
| BLK30 | BLK31 | BLK32 | BLK33 | BLK34 |
| BLK40 | BLK41 | BLK42 | BLK43 | BLK44 |

FIG. 19

| BLK00 | BLK01 | BLK02 | BLK03 | BLK04 |
|---|---|---|---|---|
| BLK10 | BLK11 | BLK12 | BLK13 | BLK14 |
| BLK20 | BLK21 | BLK22 | BLK23 | BLK24 |
| BLK30 | BLK31 | BLK32 | BLK33 | BLK34 |
| BLK40 | BLK41 | BLK42 | BLK43 | BLK44 |

FIG. 20

METHOD FOR COMPRESSING SEMICONDUCTOR INTEGRATED CIRCUIT, USING DESIGN REGION DIVIDED INTO PLURAL BLOCKS

CROSS-REFERENCE TO RELATED APPLICATIONS

This application is based upon and claims the benefit of priority from the prior Japanese Patent Application No. 2003-199140, filed on Jul. 18, 2003, the entire contents of which are incorporated herein by reference.

BACKGROUND OF THE INVENTION

1. Field of the Invention

The present invention relates to a method for compressing a semiconductor integrated circuit. This invention relates to, for example, a semiconductor integrated circuit that is designed by arranging standard cells.

2. Description of the Related Art

In recent years, remarkable developments have been made in integration density of a semiconductor integrated circuit (LSI: Large Scale Integrated Circuit). Along with these developments, a load on LSI designers has become increasingly heavier.

Conventionally, an entire LSI chip is designed as a whole. However, with an increase in the scale of an LSI, it is expected that the optimization of LSI design would become considerably difficult in the near future. An optimizing process is carried out by a design tool, but the time needed for the process has increased to several days or a week. In worst cases, the optimization is failed or is not completed.

Under the circumstances, a method of designing one chip by dividing the chip into a plurality of regions has been proposed. This proposal is disclosed in, e.g. AmmoCore Technology, fabrix Preliminary Datasheet, <URL: http://www.ammocore.com/ammocore_fabrix.pdf>, <URL: http://www.ammocore.com/fabrix_overview.pdf>. In this proposal, each of the divided regions is individually subjected to an optimizing process, following which the respective regions are connected. According to the proposal, the optimizing process can be performed in a parallel fashion, and the time needed for the process can be reduced to several hours to one day.

In the above prior-art proposal, however, it is difficult to efficiently use all regions, and a variance occurs in density of each region (high-density region/low-density region). Consequently, the efficiency of use of the area of the chip lowers, thus it is difficult to increase the compression ratio in LSI design.

BRIEF SUMMARY OF THE INVENTION

A method for compressing a semiconductor integrated circuit according to an embodiment of the present invention includes:

dividing a design region, in which a semiconductor integrated circuit is to be designed, into a plurality of blocks;

assigning semiconductor devices to each of the blocks;

determining a device density of each block;

compressing any block that is determined to have a low device density; and connecting the blocks by wiring.

BRIEF DESCRIPTION OF THE SEVERAL VIEWS OF THE DRAWING

FIG. 6 is a diagram illustrating compression of blocks in the vertical direction in the compression method of a semiconductor integrated circuit according to the first embodiment of the present invention;

FIG. 7 is a diagram illustrating compression of blocks in the horizontal direction in the compression method of a semiconductor integrated circuit according to the first embodiment of the present invention;

FIG. 19 is a diagram of a design region divided into a plurality of blocks, indicating high/low densities of standard cells in the blocks in the compression method of a semiconductor integrated circuit according to the fourth embodiment of the present invention;

FIG. 20 is a diagram illustrating a variation in the aspect ratio of "dense" (high-density) blocks in the compression method of a semiconductor integrated circuit according the fourth embodiment;

DETAILED DESCRIPTION OF THE INVENTION

Figures 1, 2:
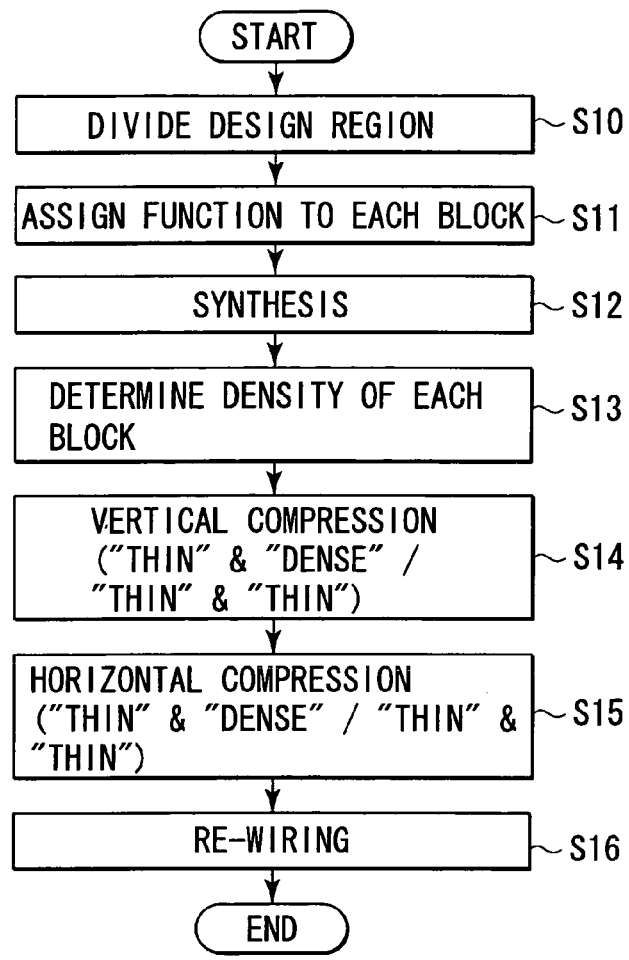
FIG. 1 is a flow chart of a compression method of a semiconductor integrated circuit according to a first embodiment of the present invention.
FIG. 2 is a diagram of a design region divided into a plurality of blocks in the compression method of a semiconductor integrated circuit according to the first embodiment of the present invention.

A method for compressing a semiconductor integrated circuit according to a first embodiment of the present invention will now be described with reference to FIG. 1. FIG. 1 is a flow chart illustrating the flow of a process of a compression method for an LSI.

Figure 3:
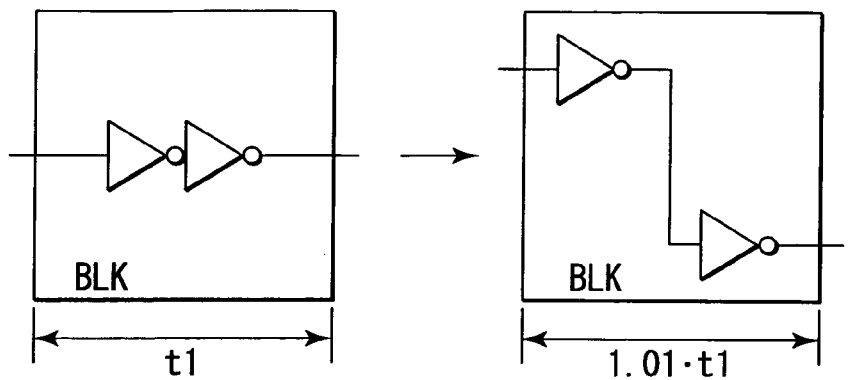
FIG. 3 is a diagram of the inside of the block, illustrating a change in wiring delay time in the compression method of a semiconductor integrated circuit according to the first embodiment of the present invention.

As is shown in FIG. 1, a design region where an LSI is to be designed is divided into blocks in a matrix (step S10). FIG. 2 shows the divided configuration of the design region. That is, FIG. 2 schematically shows the design region of the LSI. As is shown in FIG. 2, the design region 1 is divided into 25 small blocks BLK00 to BLK44. In this embodiment, the number of blocks is 25. Needless to say, the number of blocks is not limited to 25. It is desirable that each block be sized such that when standard cells are shifted within the block, a signal delay due to such shift does not affect the operation timing. For example, as illustrated in FIG. 3, assume that the time needed for the passing of a signal within one block BLK is t1. In this case, when standard cells included in the block BLK are shifted, no problem arises if the time needed for the passing of a signal within the block BLK is 1.01·t1. To be more specific, it is preferable that a variation in wiring delay, which corresponds to the length of one side of each block, be 1% of a cycle time (operation clock cycle) or less. The purpose of this design rule is to reduce an error between an analysis result of a timing analysis, which is based on a logic synthesis of functional descriptions (hereinafter referred to as "IRTL description") written by verilog-HDL (Hardware Description Language) of RTL (Register-Transfer-Level), and a wiring delay occurring when standard cells are actually disposed. If the wiring delay per block is not greater than 1%, the aforementioned error in the path extending through 10 blocks is 10% at most. In a design of an LSI operating at high frequencies, a single path comprises delays of 20 to 30 stages of inverters, and a delay used for constitution of logic corresponds to two stages on average. It is necessary, therefore, to reduce as much as possible, in terms of design, the number of paths each extending via 10 or more blocks. Hence, if the wiring delay per block is 1% or less, a sufficiently high precision in estimation of operation speed is achieved.

Next, a function is assigned to each block (step S11). The assigning of the function is carried out by RTL descriptions. This process is the same as in the prior art, so a description is omitted.

Subsequently, RTL descriptions representative of the functions assigned to the respective blocks are synthesized (step S12). Thereby, standard cells obtained by the synthesis are arranged in each block. This arrangement process can optimally be carried out using a conventional arrangement tool. Specifically, the arrangement of standard cells is optimized on a block-by-block basis.

Following the above, compression of the design region is performed. To start with, in step S13 in FIG. 1, the density ("dense"/"thin") of standard cells in each block is examined. The density in the block can be found by the ratio of an area used by standard cells to the area of the block. Whether the standard cells in the block are "dense" or "thin" means the efficiency of use of area of the block. The criterion for determining whether the block is "dense" (high density) or "thin" (low density) may vary depending on the number of wiring layers, for instance, but it is desirable to set the criterion level at about 60% to 80%. Of course, the value of the criterion is not limited to 60% to 80% and it may vary from product to product. Assume that the densities ("dense"/

Figure 4:
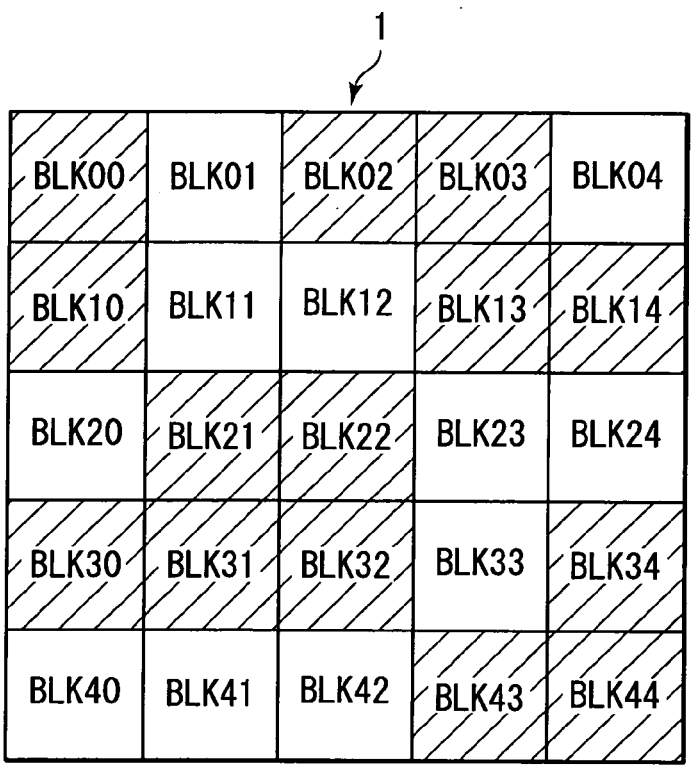
FIG. 4 is a diagram of a design region divided into a plurality of blocks, indicating high/low densities of standard cells in the blocks in the compression method of a semiconductor integrated circuit according to the first embodiment of the present invention.

"thin") of blocks included in the design region shown in FIG. 2 are as indicated in FIG. 4. FIG. 4 schematically shows the design region. The blocks indicated by hatching are "dense" and the blocks without hatching are "thin".

Figure 5:
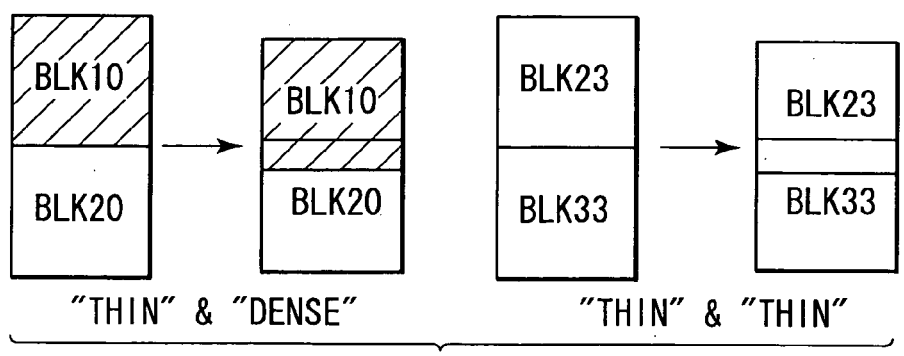
FIG. 5 is a diagram illustrating compression of blocks in the compression method of a semiconductor integrated circuit according to the first embodiment of the present invention.

In a case where standard cells are vertically arranged in the block, compression is made in the vertical direction in which strict constraints are imposed (step S14). Specifically, the blocks are shifted such that a "thin" block and a "dense" block are overlapped, and thin blocks are overlapped. More specifically, as shown in FIG. 5, when a "dense" block BLK10 and a "thin" block BLK20 are adjacent, the blocks BLK10 and BLK20 are shifted to partly overlap each other. In addition, adjoining "thin" blocks BLK23 and BLK33 are shifted to partly overlap each other. This process is executed over the entire design region 1. In this case, the ratio between an average area use efficiency of each block and a target area use efficiency is found. Then, the blocks are overlapped to make the area use efficiency of the entire design region equal to the target area use efficiency. In a region where two blocks overlap, an overlapping of disposed standard cells occurs. Such an overlapping of standard cells is eliminated by performing "ECO place" using a conventional arrangement tool. As a result of step S14, a design region in which plural blocks are vertically overlapped is obtained, as shown in FIG. 6.

Subsequently, compression in the horizontal direction is performed (step S15). In this process, the processing of step S14 is conducted for the horizontal direction of blocks. As a result, as shown in FIG. 7, a design region 1 in which a plurality of blocks are vertically and horizontally overlapped is obtained. Note that the processings of steps S14 and S15 may be repeated, depending on the case.

Thereafter, wiring is performed on the standard cell level (step S16). This process can be performed by a conventional wiring tool.

The designing of the LSI is thus completed.

As has been described above, in the compression method of the semiconductor integrated circuit according to the present embodiment, the design region is divided into a plurality of blocks and a function is assigned to each block. Then, adjacent blocks with low area use efficiency, that is, adjacent "thin" blocks with low density of standard cells in the blocks, are overlapped. Further, a block with high area use efficiency, that is, a "dense" block with high density of standard cells in the block, and a block with low area use efficiency, which are adjacent to each other, are overlapped. As a result, the design area of the semiconductor integrated circuit can be reduced.

Moreover, the size of each block is set such that when standard cells are shifted within the block, a signal delay due to such shift may not affect the operation timing. Therefore, the design area can be reduced without degrading the operation timing.

Further, standard cells are arranged on each block, which is smaller in size than the entire design region. Thus, the arranging of standard cells on the entire design is facilitated, and the time for arranging the standard cells is shortened. As a result, the load on designers is lightened. Furthermore, the arranging of standard cells can easily be optimized.

Figure 8:
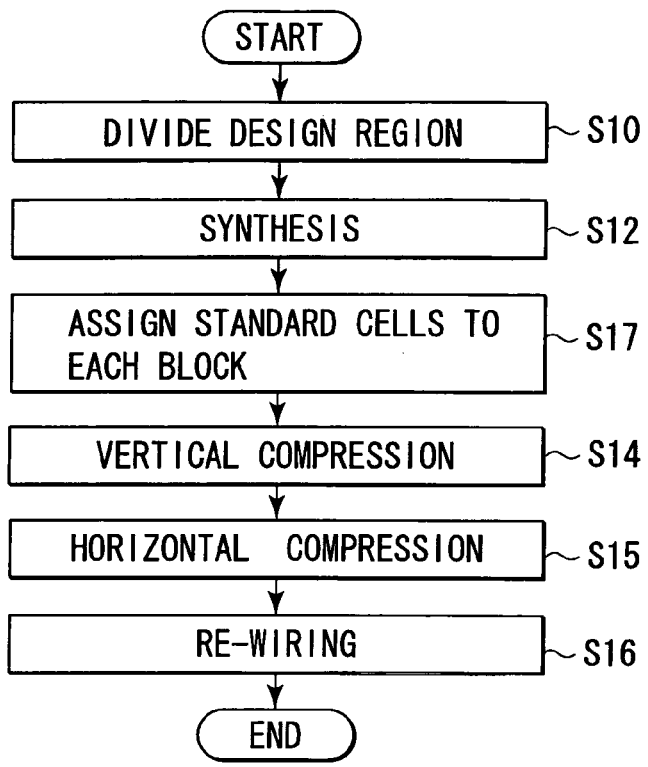
FIG. 8 is a flow chart of a compression method of a semiconductor integrated circuit according to a modification of the first embodiment of the present invention.

FIG. 8 is a flow chart of a compression method of a semiconductor integrated circuit according to a modification of the first embodiment. As is illustrated in FIG. 8, RTL descriptions may be synthesized before assigning the function to each block. Specifically, when the function is assigned to each block, a net after synthesis may be used instead of RTL description. In other words, synthesis is performed in advance, and then a net list is obtained. By tracking back the net list from the register input, the standard cells can be assigned to each block (step S17).

According to this method, logics are already described by standard cells. Based on the total area of the assigned standard cells, the density in the block can be understood. Therefore, the density ("dense"/"thin") of the block can be determined without the need to check the design after arrangement of standard cells. In other words, the processing in step S13 in FIG. 1 is needless. In this case, redundant area conversion calculation is needless, and the design of the semiconductor integrated circuit can be simplified.

In another method, blocks represented by the same signal name, e.g. A[3:0], in the RTL description, thus the logics may be divided by bit slices by tracking back the net list from a plurality of registers (step S11). The degree of correlation between signals is high at the same bit, and thus wiring is effectively performed within the blocks and the number of wires extending over the blocks can be reduced.

Figure 9:
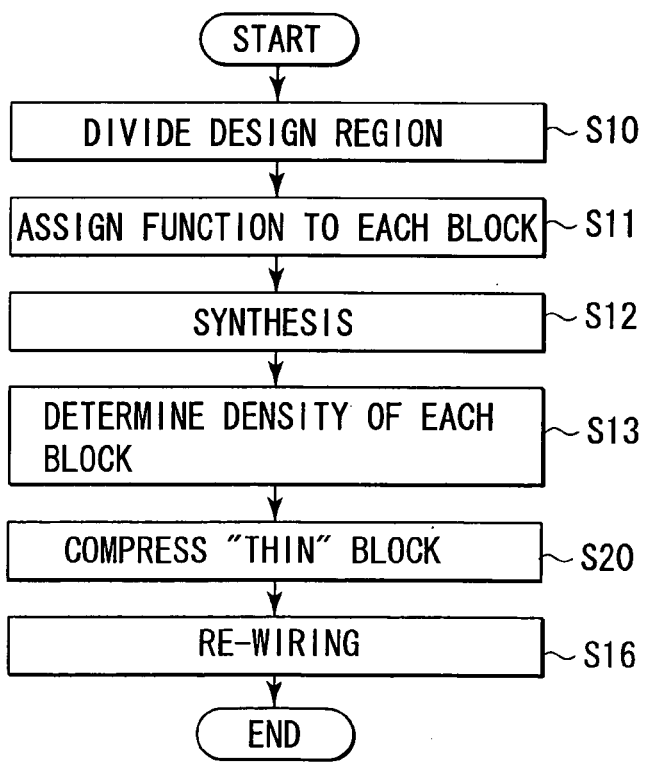
FIG. 9 is a flow chart of a compression method of a semiconductor integrated circuit according to a second embodiment of the present invention.

A compression method for a semiconductor integrated circuit according to a second embodiment of the present invention will now be described with reference to FIG. 9. In the second embodiment, like the first embodiment, "thin" blocks are compressed. In this case, the block size of the "thin" blocks is decreased. FIG. 9 is a flow chart illustrating the flow of the process of an LSI compression method.

Figure 10:
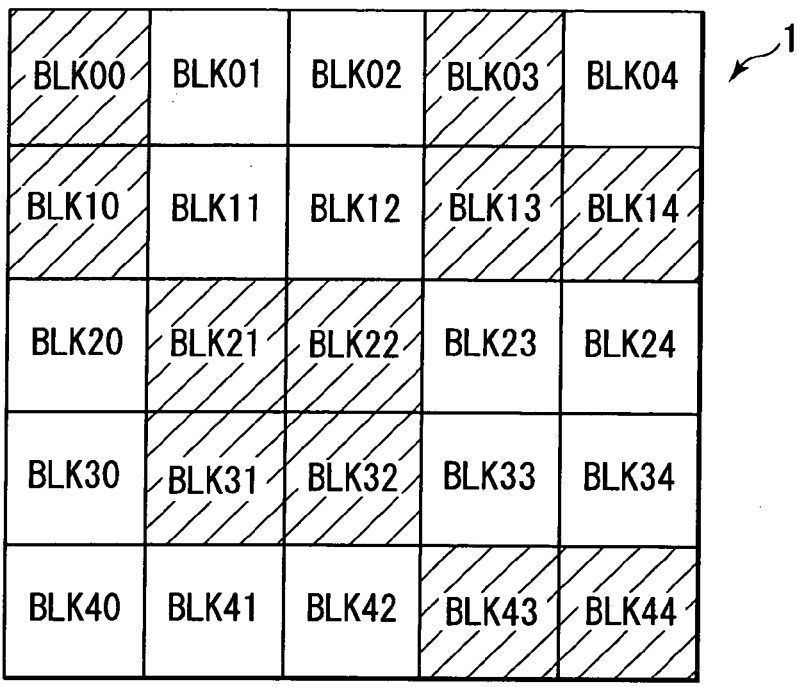
FIG. 10 is a diagram of a design region divided into a plurality of blocks, indicating high/low densities of standard cells in the blocks in a compression method of a semiconductor integrated circuit according to the second embodiment of the present invention.

Like the first embodiment, the process of steps S10 to S13 is executed. Assume that a "dense/thin" determination result of each block is as shown in FIG. 10. FIG. 10 schematically shows a design region of an LSI. The blocks indicated by hatching are those determined to be "dense", and the blocks without hatching are those determined to be "thin".

Figure 11:
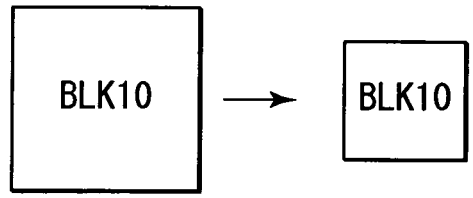
FIG. 11 is a diagram illustrating compression of blocks in the compression method of a semiconductor integrated circuit according to the second embodiment of the present invention.
Figure 12:
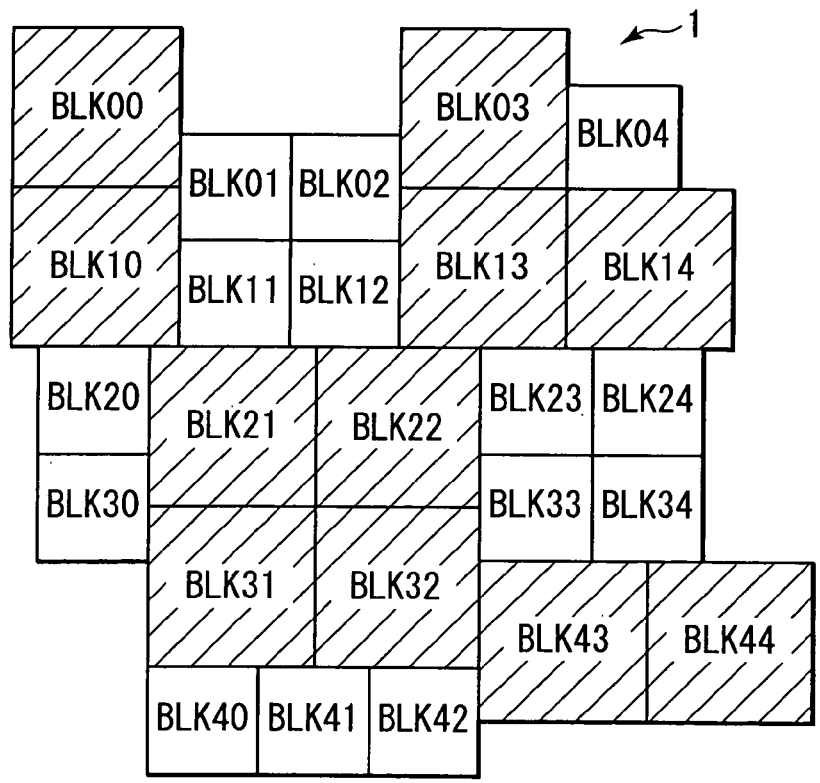
FIG. 12 is a diagram illustrating compression of blocks in the compression method of a semiconductor integrated circuit according to the second embodiment of the present invention.

As is shown in FIG. 11, the block size of the "thin" block is reduced and compressed (step S20). In the case of vertical compression, this is easily realized by multiplying the Y-coordinate value of the cell arrangement information by a compression ratio. Needless to say, in the case of horizontal compression, this is realized by multiplying the X-coordinate value by a compression ratio. In a case where the block size needs to be a constant value due to constraints imposed on the arrangement tool, it should suffice if a value obtained by the multiplication by a compression ratio is rounded to the predetermined value. As a result, the design region 1 is compressed as shown in FIG. 12.

In the subsequent step S16, wiring is performed on the standard cell level, and the designing of the LSI is completed.

As has been described above, by reducing the block size of each "thin" block, the same advantages as in the first embodiment can be obtained.

Figure 13:
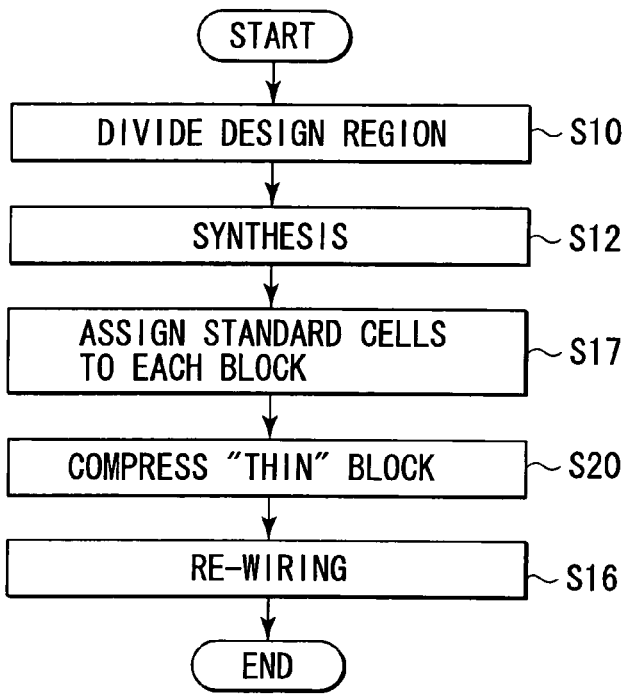
FIG. 13 is a flow chart of a compression method of a semiconductor integrated circuit according to a modification of the second embodiment of the present invention.

FIG. 13 is a flow chart of a method for compressing a semiconductor integrated circuit according to a modification of the second embodiment of the present invention. As is shown in FIG. 13, like the modification of the first embodiment, RTL descriptions may be synthesized before assigning the function to each block.

Figure 14:
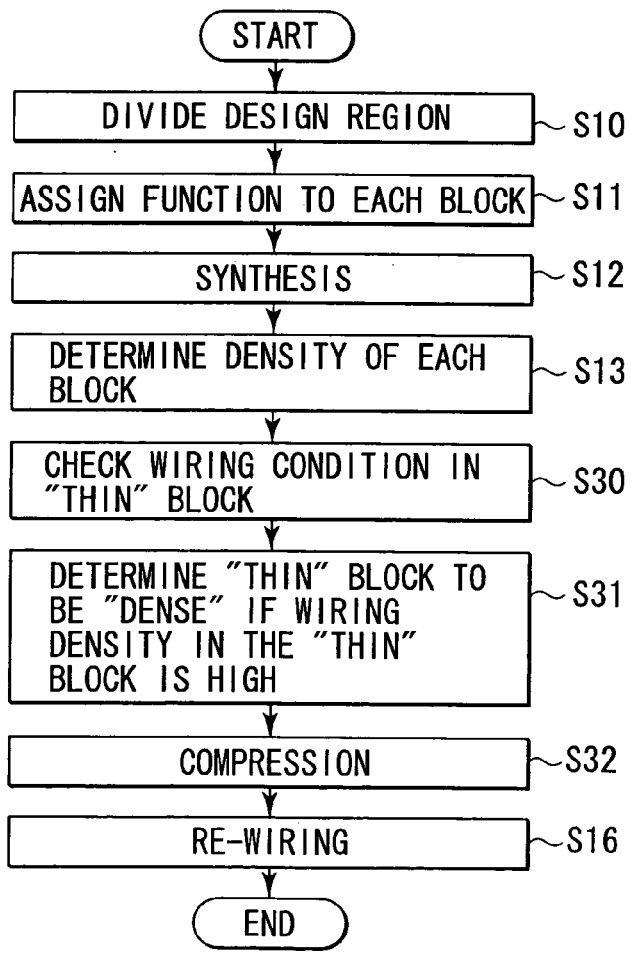
FIG. 14 is a flow chart of a compression method of a semiconductor integrated circuit according to a third embodiment of the present invention.

A compression method of a semiconductor integrated circuit according to a third embodiment of the present invention will now be described with reference to FIG. 14. In the third embodiment, when the wiring density of the block, which is determined to be "thin" in the first and second embodiments, is "dense", this block is not compressed. FIG. 14 is a flow chart illustrating the flow of the process of the LSI compression method.

To begin with, like the first embodiment, the process of steps S10 to S13 is performed.

Figure 15:
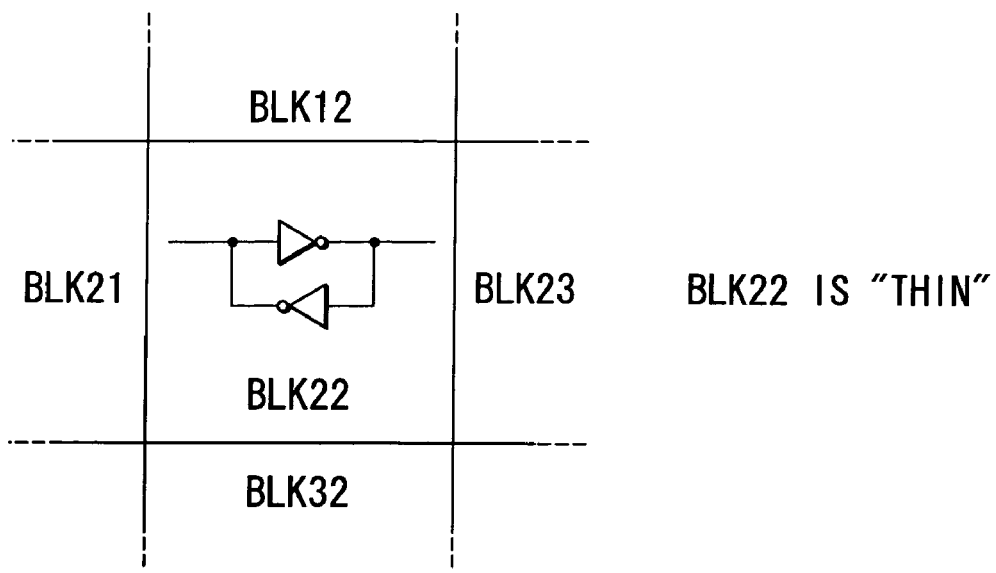
FIG. 15 is a diagram showing an example of standard cells disposed in the block in the compression method of a semiconductor integrated circuit according to the third embodiment of the invention.
Figure 16:
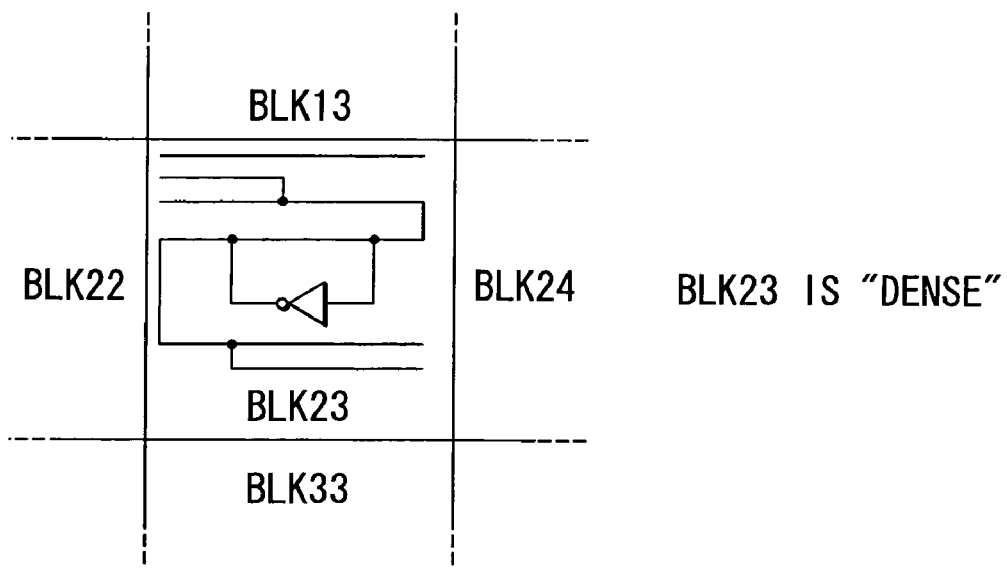
FIG. 16 is a diagram showing an example of standard cells disposed in the block in the compression method of a semiconductor integrated circuit according to the third embodiment of the invention.

Next, the density of wiring in the "thin" block is checked (step S30). If the density of wiring in the "thin" block is high, it is determined that the density of semiconductor devices in the block is high (step S31). The processing in steps S30 and S31 is described with reference to FIGS. 15 and 16. FIGS. 15 and 16 are circuit diagrams of some blocks. As shown in these Figures, assume that when RTL descriptions are synthesized and standard cells are assigned to each block, each of the blocks BLK22 and BLK23 includes one latch circuit (two inverters). In addition, assume that the block BLK22 is determined to be "thin" in step S13. The block BLK23 is also determined to be "thin" since it includes only one latch circuit, as shown in FIG. 16. However, the density of wiring differs greatly between the block BLK22 and the block BLK23. Specifically, in the block BLK22, most of the area, except for the two inverters, is empty. By contrast, in the block BLK23, although two inverters are provided, the number of wires is large, thus there is little empty space in the block BLK23. In this manner, the block, which has been determined to be "thin" despite the fact that there is little space in the block due to the wires, is determined to be "dense".

Subsequently, the blocks, which have been determined to be "thin", are compressed (step S32). The compression method of blocks is the same as employed in the first and second embodiments. Specifically, adjacent "thin" blocks may be overlapped, a "thin" block and a "dense" block may be overlapped, or the block size of a "thin" block may be reduced.

In step S16, the wiring on the standard cell level is carried out, and the designing of the LSI is completed.

As has been described above, according to the compression method of the semiconductor integrated circuit according to the third embodiment, the following advantages can be obtained in addition to the advantages of the first and second embodiments. Re-wiring of design is made easier. Specifically, the "thin" block with low wiring density has an extra space for re-wiring even after it is compressed. Therefore, wiring can easily be made. However, if the block, which has a low cell density in the block but has the other region fully occupied by wires, is compressed, there is no extra space for re-wiring. Consequently, re-wiring is very difficult or cannot be performed in some cases.

According to the method of the present embodiment, however, the density ("dense"/"thin") of cells in each block is first examined, and then the density of wiring is checked. A block, which has a low cell density but has a high wiring density, is determined to be "dense" and this block is not compressed. Therefore, re-wiring of design is facilitated.

Figure 17:
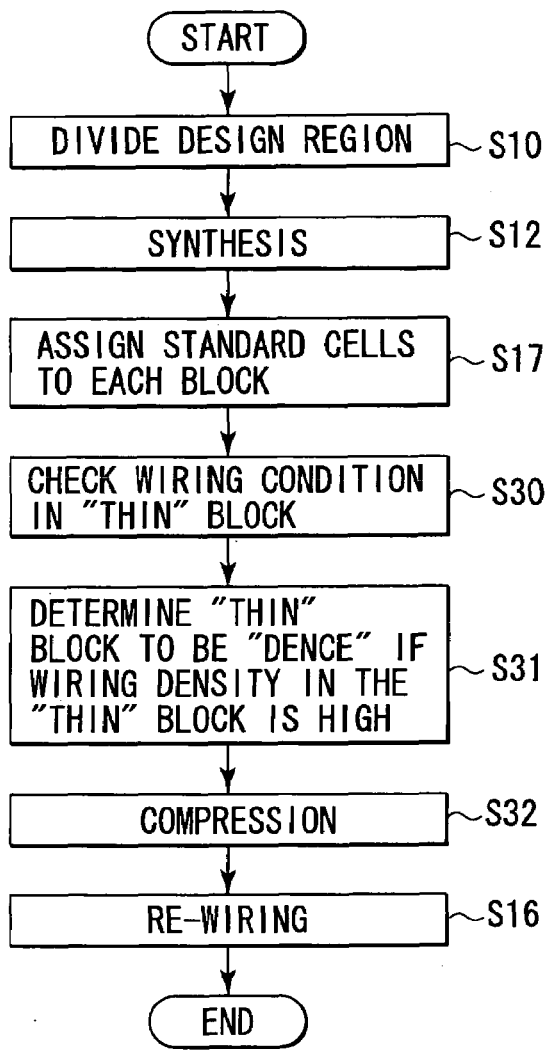
FIG. 17 is a flow chart of a compression method of a semiconductor integrated circuit according to a modification of the third embodiment of the present invention.

FIG. 17 is a flow chart of a compression method of a semiconductor integrated circuit according to a modification of the third embodiment of the present invention. As is shown in FIG. 17, in this modification, like the modification of the first embodiment, RTL descriptions may be synthesized before assigning the function to each block.

Figure 18:
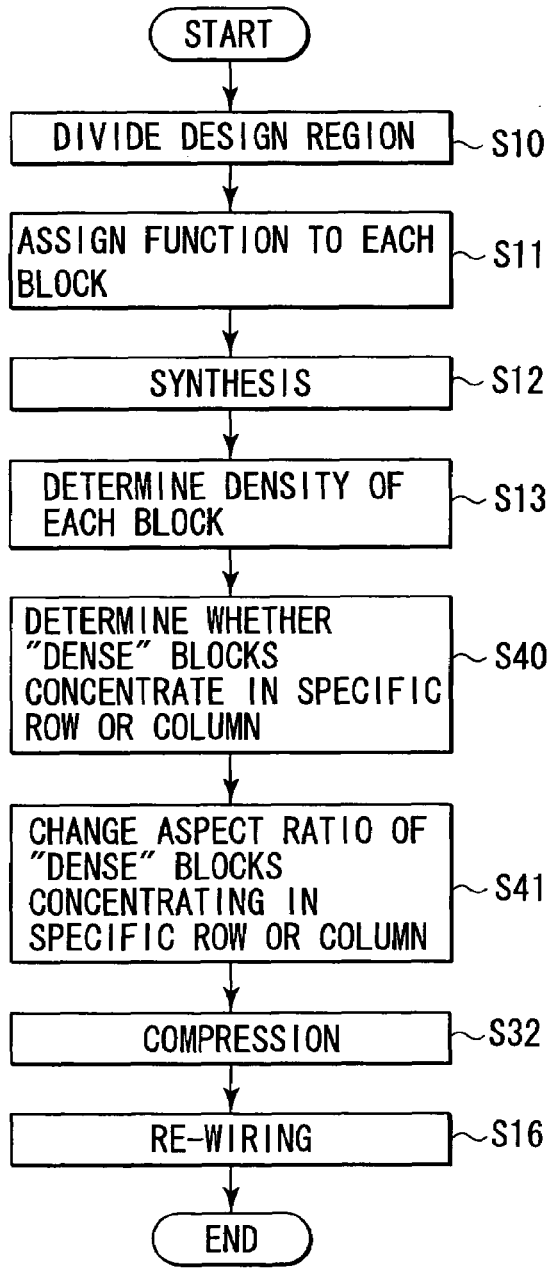
FIG. 18 is a flow chart of a compression method of a semiconductor integrated circuit according to a fourth embodiment of the present invention.

A compression method of a semiconductor integrated circuit according to a fourth embodiment of the invention will now be described with reference to FIG. 18. The fourth embodiment differs from the first and second embodiments in that the block size of "dense" blocks, which concentrate in a specific row or column, is changed. FIG. 18 is a flow chart illustrating the flow of the process of the LSI compression method.

To start with, like the first embodiment, the process of steps S10 to S13 is carried out. Assume that the design region is determined in step S13 as shown in FIG. 19. FIG. 19 schematically shows the design region.

It is then determined whether "dense" blocks are present in a concentrated fashion in a specific row or column (step S40). In this example, as shown in FIG. 19, blocks BLK02 to BLK42, which are present in a specific column, are determined to be "dense" and the other blocks are determined to be "thin".

Next, the aspect ratio of each "dense" block concentrating in a specific row or column is changed (step S41). This is realized by multiplying cell arrangement coordinates by a change ratio of one side of the block. Specifically, as shown in FIG. 20, the aspect ratio of each of the blocks BLK02 to BLK42 concentrating in a specified column is changed and the vertical size is reduced without changing the area of each block.

Figure 21:
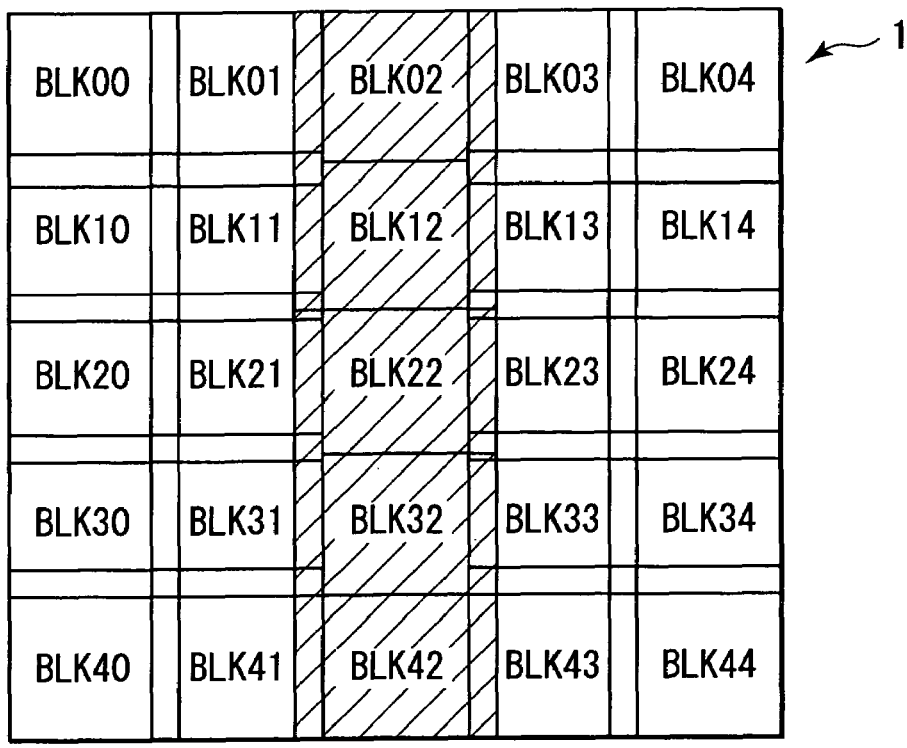
FIG. 21 is a diagram illustrating compression of blocks in the compression method of a semiconductor integrated circuit according to the fourth embodiment of the present invention.

Thereafter, the blocks that have been determined to be "thin" are compressed (step S32). The block compression method that is used is the same as in the first and second embodiments. Specifically, adjacent "thin" blocks may be overlapped, a "thin" block and a "dense" block may be overlapped, or the block size of a "thin" block may be reduced. FIG. 21 shows a design region where "thin" blocks are compressed by the method of the first embodiment, and FIG. 22 shows a design region where "thin" blocks are compressed by the method of the second embodiment.

In the subsequent step S16, wiring is performed on the standard cell level, and the designing of the LSI is completed.

As has been described above, with the compression method of the semiconductor integrated circuit according to this embodiment, the same advantages as with the first and second embodiments are obtained. Moreover, the design area can be reduced more efficiently. In the case where the "dense" blocks concentrate in a specific row or column, as shown in FIG. 19, this row or column can hardly be compressed. However, according to the present embodiment, the aspect ratio of each "dense" block is altered without changing the area of the block. Therefore, even in the case of FIG. 19, the design region can be reduced as a whole.

Figure 22:
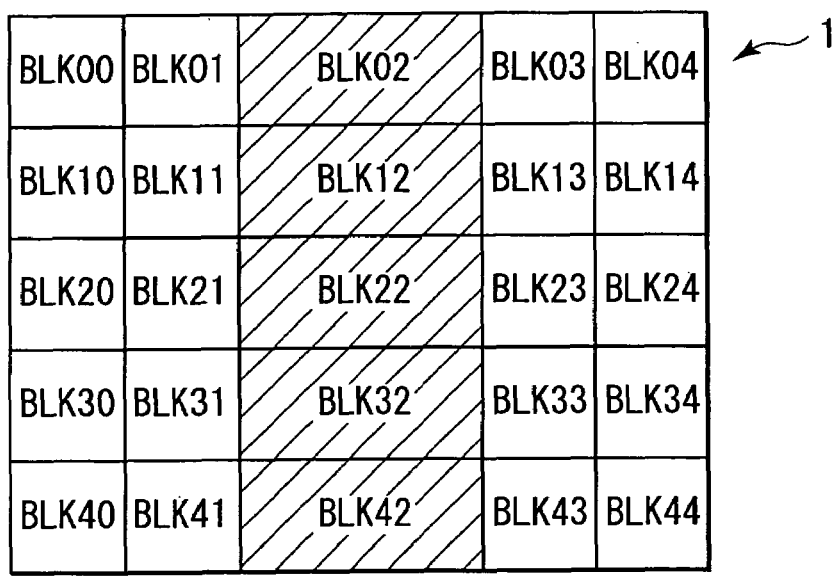
FIG. 22 is a diagram illustrating compression of blocks in the compression method of a semiconductor integrated circuit according to the fourth embodiment of the present invention.

In a case where the aspect ratio of a "dense" block is to be altered, it is desirable that the size of the row or column, in which "dense" blocks are concentrated, be made equal to the size of a row or column, which is obtained by compressing "thin" blocks (see FIG. 21 and FIG. 22).

Figure 23:
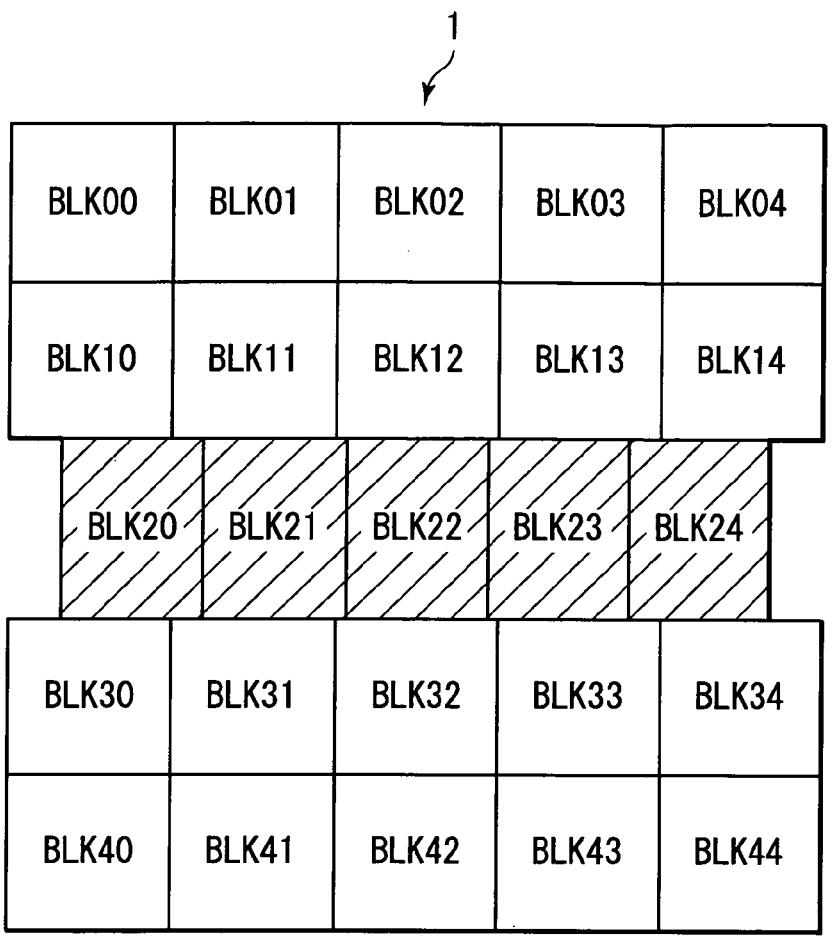
FIG. 23 is a diagram illustrating a variation in the aspect ratio of "dense" (high-density) blocks in the compression method of a semiconductor integrated circuit according the fourth embodiment of the invention.

The above-described embodiment is directed to the case where "dense" blocks concentrate in a specific column. In this case, the vertical dimension of each block is decreased by increasing the horizontal dimension of each block. However, in a case where "dense" blocks concentrate in a specific row, the horizontal dimension of the block is decreased by increasing the vertical dimension of the block, as shown in FIG. 23.

Figure 24:
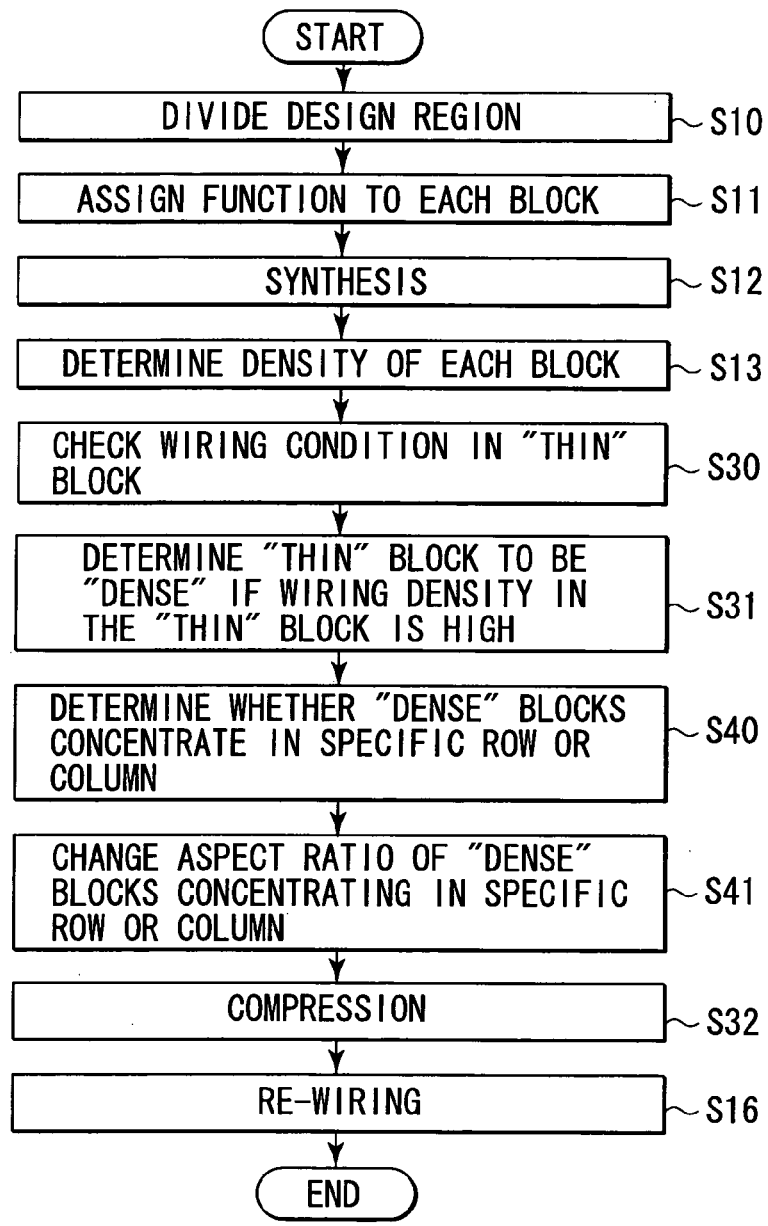
FIG. 24 is a flow chart of a compression method of a semiconductor integrated circuit according to a first modification of the fourth embodiment of the present invention.

Further, this embodiment may be combined with the third embodiment. That is, as shown in FIG. 24, the steps S30 and S31 described in connection with the third embodiment may be inserted between steps S13 and S40. In this case, the blocks including blocks, which are first determined to be "dense" in step S31, are subjected to the processing in step S40.

Figure 25:
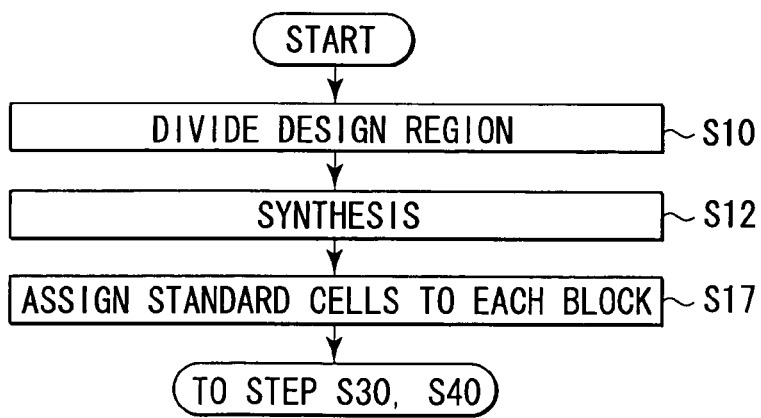
FIG. 25 is a flow chart of a compression method of a semiconductor integrated circuit according to a second modification of the fourth embodiment of the present invention.

As is shown in FIG. 25, in the compression methods of FIGS. 18 and 24, RTL descriptions may be synthesized before assigning the function to each block, as in the modification of the first embodiment.

Figure 26:
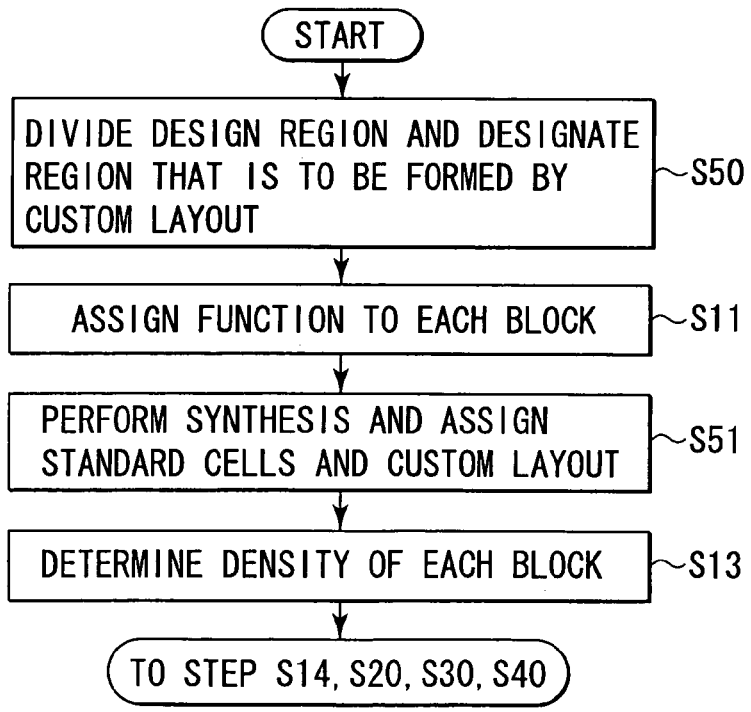
FIG. 26 is a flow chart of a compression method of a semiconductor integrated circuit according to a fifth embodiment of the present invention.

A compression method of a semiconductor integrated circuit according to a fifth embodiment of the present invention will now be described referring to FIG. 26. The fifth embodiment differs from the first to fourth embodiments in that at least one of the blocks is formed by a custom layout. FIG. 26 is a flow chart illustrating the flow of the process of an LSI compression method.

Figure 27:
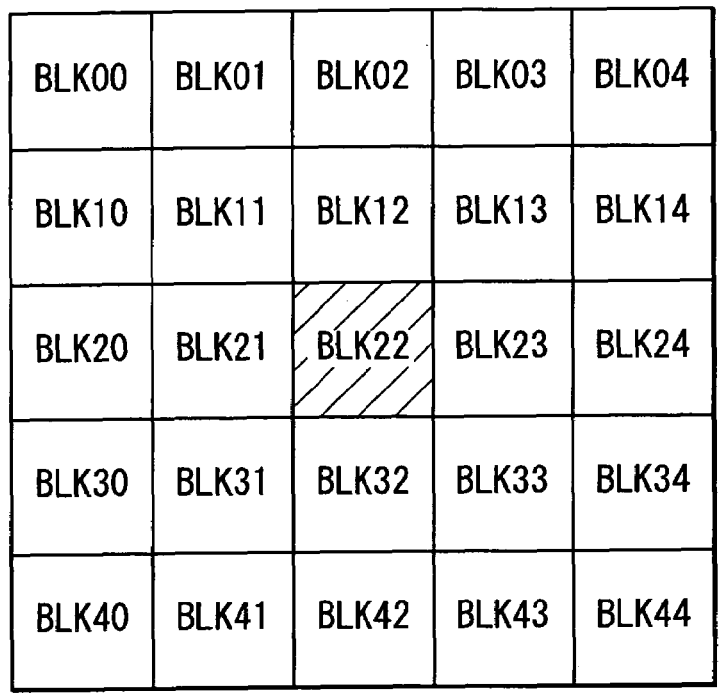
FIG. 27 is a diagram of a design region divided into a plurality of blocks in the compression method of a semiconductor integrated circuit according to the fifth embodiment of the present invention.

To start with, as illustrated in FIG. 26, a design region, where an LSI is to be designed, is divided into blocks in a matrix (step S50). This process is the same as the process of step S10 in the first embodiment. In this case, a region, which is to be formed by a custom layout and not by standard cells, is designated. FIG. 27 illustrates this process. FIG. 27 schematically shows an LSI design region. As shown in FIG. 27, in step S50, a design region 1 is divided into 25 blocks BLK00 to BLK44, and the block BLK22, for instance, is designated as a region to be formed by a custom layout.

Like the first embodiment, functions are assigned to the respective blocks (step S11). Then, logic synthesis is performed to assign standard cells and a custom layout (step S51). Specifically, the block designated in step S50 is first detected. A custom layout is assigned to the detected block (block BLK22 in FIG. 27), and RTL descriptions in the other blocks are replaced with standard cells.

Thereafter, the density ("dense"/"thin") of each block is checked (step S13), and the process advances to step S14, S20, S30 or S40 described in connection with the first to fourth embodiments.

As has been described above, with the compression method of the semiconductor integrated circuit according to the fifth embodiment, the advantages of the first to fourth embodiments are obtained. In addition, not only a design method using standard cells but also a design method using a custom layout can easily be adopted. As regards some specific arithmetic devices or memories, it is advantageous to design them using the custom layout, rather than standard cells. This is understandable from the beginning of design. In this case, it is preferable to design a series of functional descriptions, such as modules, by using custom layouts in advance. According to the present embodiment, the respective blocks are associated with the corresponding functions, so that one LSI can easily be designed using two design methods, i.e. the standard cell design method and custom layout design method.

Figure 28:
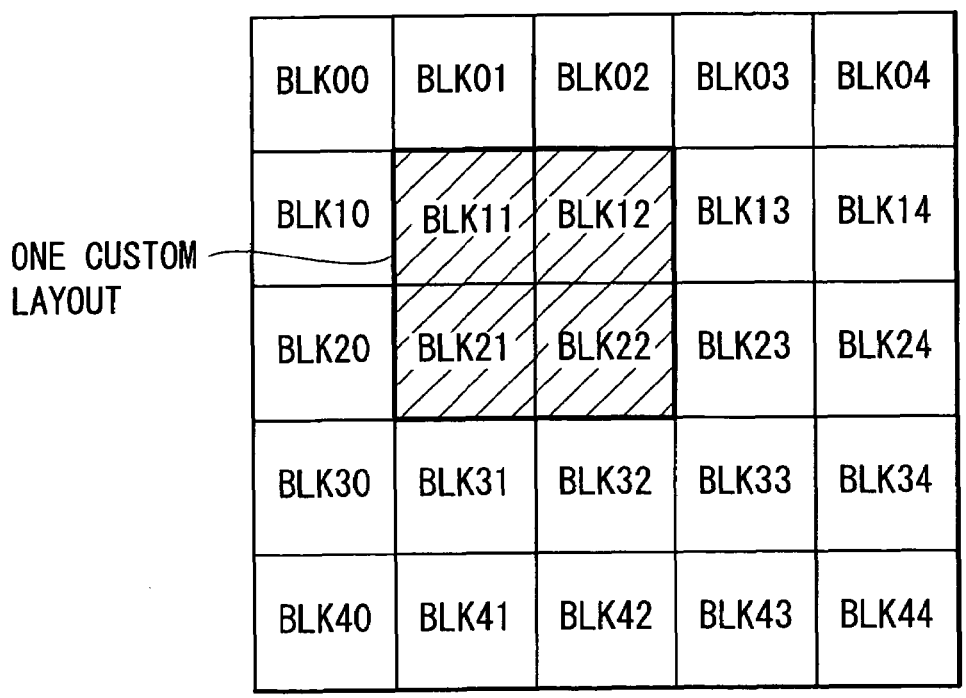
FIG. 28 is a diagram of a design region divided into a plurality of blocks in the compression method of a semiconductor integrated circuit according to the fifth embodiment of the present invention, wherein a custom layout is provided over a plurality of blocks.

This embodiment is directed to, by way of example, the case where the number of blocks to be designed by the custom layout method is one. This number, however, is not limited. In the case where one custom layout is assigned to a plurality of blocks, it is desirable to fix the positional relationship between the blocks. FIG. 28 shows a case where one custom layout extends over four blocks BLK11, BLK12, BLK21 and BLK22. In this case, it is necessary to make the positional relationship of these blocks unchanged in the optimization process in step S12.

In general, the custom layout can enhance the area usage efficiency/performance, compared to the standard cell design method. On the other hand, the standard cell design method has a higher degree of freedom for the shape/arrangement, and can easily be adapted to a variation in processes. Thus, when the same design is re-used in different processes, advantages/disadvantages may change between the custom layout design method and standard cell design method. In this case, the custom-layout-based block is replaced with a standard cell-based block having the same function, and the process beginning with the synthesis in step S51 is re-executed. Thereby, there is no need to change RTL descriptions.

Figure 29:
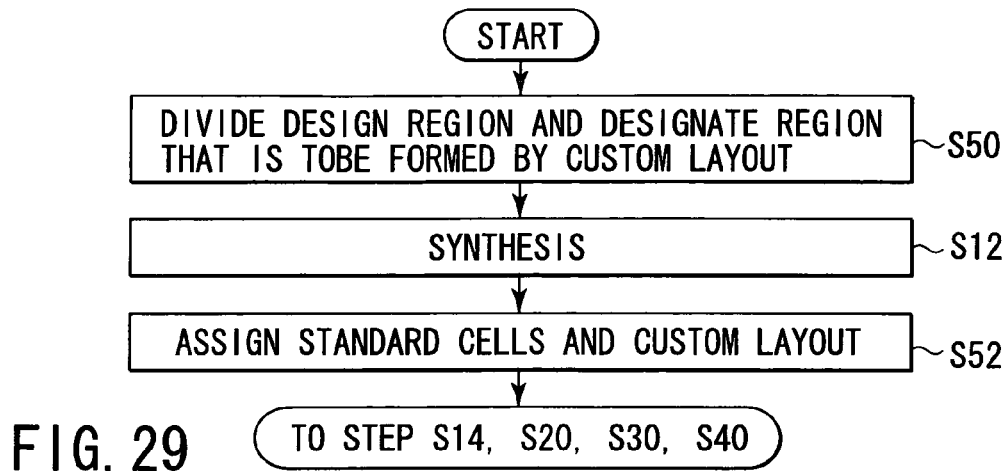
FIG. 29 is a flow chart of a compression method of a semiconductor integrated circuit according to a modification of the fifth embodiment of the present invention.

As is shown in FIG. 29, in the present embodiment, like the modification of the first embodiment, synthesis of RTL descriptions may be performed prior to assigning functions to the respective blocks. Both a custom layout and standard cells obtained by logic synthesis may be assigned to the respective blocks.

As has been described above, in the compression method of the semiconductor integrated circuit according to the first to fifth embodiments of the invention, the LSI design region is divided into a plurality of small blocks. After standard cells are disposed, the density of each block is checked. Then, the "thin" block with a low density of standard cells is compressed. Thereby, the design area is reduced. Further, when the design region is divided into blocks, each block is sized such that when standard cells are shifted within the block, a signal delay due to such shift may not affect the operation timing. Therefore, the design area can be reduced without adversely affecting the operation timing.

Figure 30:
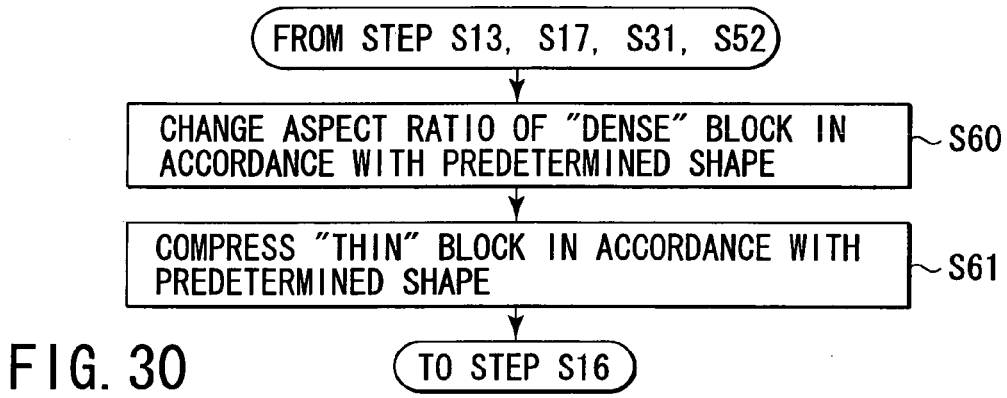
FIG. 30 is a flow chart of a compression method of a semiconductor integrated circuit according to a first modification of the first to fifth embodiments of the present invention.

If there is a requirement, the shape of the design area after compression can be made to conform to the required shape. This example is described referring to FIG. 30. FIG. 30 is a flow chart of the compression method according to a first modification of the first to fifth embodiments.

Figure 31:
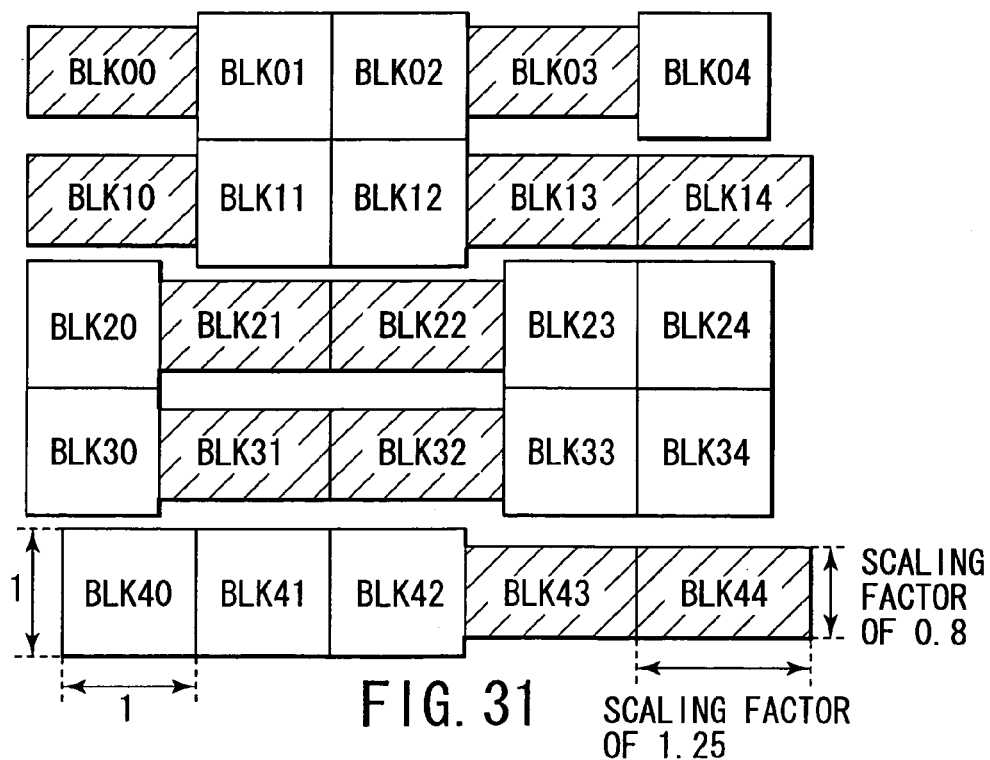
FIG. 31 is a diagram illustrating a variation in the aspect ratio of "dense" (high-density) blocks in the compression method of a semiconductor integrated circuit according the first modification of the first to fifth embodiments.

As illustrated in FIG. 30, following the steps S13, S17, S31 and S52 described in connection with the first to fifth embodiments, the aspect ratio of the "dense" block is altered according to a predetermined shape (step S60). For example, assume that the "dense/thin" relationship in the design region is as shown in FIG. 10. Also assume that there is a requirement that the design region after compression should change to a scaling factor of 0.9 in the horizontal dimension and a scaling factor of 0.8 in the vertical dimension. In accordance with this requirement, the aspect ratio of each "dense" block is altered so as not to change the area of the block. FIG. 31 shows the state of this process. In FIG. 31, the vertical dimension of each "dense" block is changed to a scaling factor of 0.8 and the horizontal dimension of each "dense" block is changed to a scaling factor of 1.25.

Figure 32:
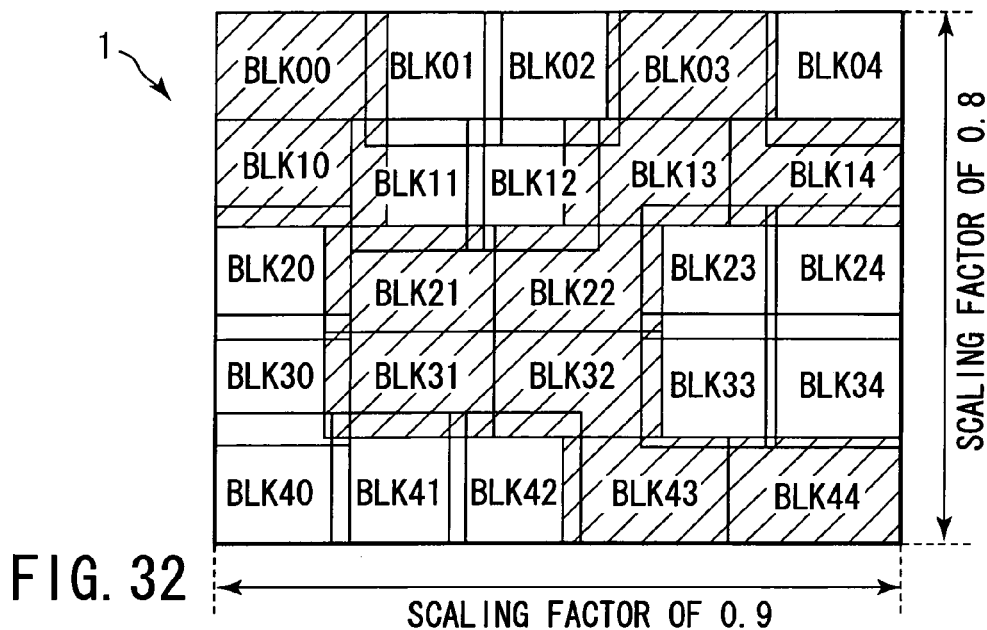
FIG. 32 is a diagram illustrating compression of blocks in the compression method of a semiconductor integrated circuit according to the first modification of the first to fifth embodiments of the present invention.

In step S61 in FIG. 30, the "thin" blocks are compressed in accordance with a predetermined shape. FIG. 32 shows the state of this process. As is shown in FIG. 32, the "thin" blocks are overlapped with the "dense" blocks so that the entire design region may vary to a scaling factor of 0.9 in the horizontal dimension and a scaling factor of 0.8 in the vertical dimension, compared to the pre-compressed state. The method of overlapping is the same as that in the first embodiment.

Figure 33:
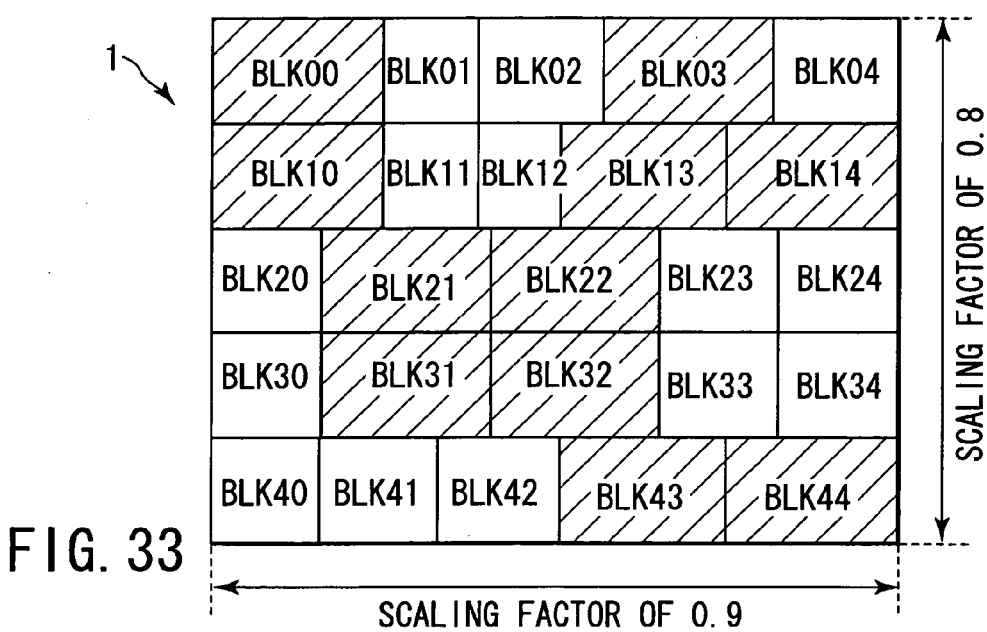
FIG. 33 is a diagram illustrating compression of blocks in the compression method of a semiconductor integrated circuit according to the first modification of the first to fifth embodiments of the present invention.

In step S61, the "thin" blocks may be compressed by the method described in the second embodiment. Specifically, as shown in FIG. 33, the "thin" blocks are compressed so that the entire design region may vary to a scaling factor of 0.9 in the horizontal direction and a scaling factor of 0.8 in the vertical direction, compared to the pre-compressed state.

According to this modification, even in the case where there is a requirement that the design region be changed to a predetermined shape, this requirement can be met. In the example of FIGS. 31 to 33, the size of each "dense" block is uniformly changed to a scaling factor of 0.8 in the horizontal direction and a scaling factor of 1.25 in the vertical direction. However, the size may be varied from block to block. For example, there may be a case where some "dense" blocks may be changed to a scaling factor of 0.8 in the horizontal direction and a scaling factor of 1.25 in the vertical direction, other "dense" blocks may be changed to a scaling factor of 1.25 in the horizontal direction and a scaling factor of 0.8 in the vertical direction, and the other "dense" blocks may be unchanged in the horizontal and vertical directions.

Figure 34:
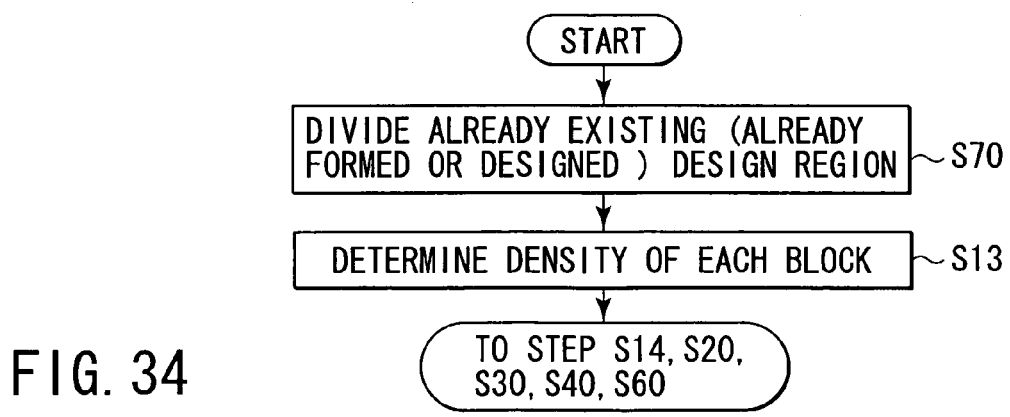
FIG. 34 is a flow chart of a compression method of a semiconductor integrated circuit according to a second modification of the first to fifth embodiments of the present invention.

In the first to fifth embodiments, after the design region is divided into blocks, the functions are assigned to the blocks (assignment of standard cells). However, this order may be reversed. A compression method in this case is described with reference to FIG. 34. FIG. 34 is a flow chart of a compression method according to a second modification of the first to fifth embodiments.

As is shown in FIG. 34, an already designed region (in which standard cells are already disposed) is divided into a plurality of blocks (step S70). The process in step S70 is the same as the process in step S10 described in connection with the first embodiment.

Next, the density ("dense"/"thin") of each block is determined (step S13). That is, the density of standard cells included in each block is checked. Then, the process advances to steps S14, S20, S30, S40 or S60 described in connection with the first to fifth embodiments and their first modification.

According to the present modification, the first to fifth embodiments can be applied to an already existing design in which functions have been assigned. In this case, too, it does not matter whether the semiconductor circuits are designed by standard cells or a custom layout.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for compressing a semiconductor integrated circuit, comprising:
   dividing a design region, in which a semiconductor integrated circuit is to be designed, into a plurality of blocks;
   assigning semiconductor devices to each of the blocks;
   determining a device density of each block;
   compressing any block that is determined to have a low device density;
   connecting the blocks by wiring;
   wherein in the assigning of the semiconductor devices to each of the blocks, the semiconductor devices assigned to a plurality of the blocks are designed by a custom layout, and the semiconductor devices assigned to the other blocks are designed by standard cells, and
   a mutual positional relationship between the plurality of the blocks, to which the semiconductor devices are assigned by the custom layout, is kept unchanged at a time of optimization.

2. The method for compressing a semiconductor integrated circuit according to claim 1, wherein the assigning of the semiconductor devices comprises:
   assigning functions to the respective blocks by functional descriptions; and
   obtaining standard cells by synthesizing the functional descriptions.

3. The method for compressing a semiconductor integrated circuit according to claim 1, wherein the assigning of the semiconductor devices comprises:
   assigning standard cells, which are obtained by synthesizing functional descriptions, to each of the blocks.

4. The method for compressing a semiconductor integrated circuit according to claim 1, wherein in the assigning of the semiconductor devices to each of the blocks, arrangement of the semiconductor devices is optimized on a block-by-block basis.

5. The method for compressing a semiconductor integrated circuit according to claim 1, wherein the size of each of the divided blocks is set such that when the positions of the semiconductor devices are shifted within the block, a wiring delay due to the shift does not affect an operation of the semiconductor integrated circuit.

6. The method for compressing a semiconductor integrated circuit according to claim 5, wherein a time of the wiring delay, which varies when the positions of the semiconductor devices are shifted within each block, is 1% or less of an operational clock cycle of the semiconductor integrated circuit.

7. The method for compressing a semiconductor integrated circuit according to claim 1, wherein the compressing of the block includes overlapping adjacent blocks with the low device density and overlapping a block with the low device density and a block with a high device density, which are located adjacent to each other.

8. The method for compressing a semiconductor integrated circuit according to claim 1, wherein the compressing of the block includes reducing the size of a block with a low device density.

9. The method for compressing a semiconductor integrated circuit according to claim 1, further comprising:
   determining a wiring density in the block, which is determined to have the low device density, prior to the compressing of the block; and
   determining any block found to have a wiring density equal to or higher than a predetermined value, to be one that has a high device density.

10. The method for compressing a semiconductor integrated circuit according to claim 1, further comprising:
    determining, prior to the compressing of the block, whether the blocks, which are determined to be "dense", concentrate in a specific row or column; and
    reducing, when the block, which have the high device density, are determined to concentrate in a specific row, the horizontal dimension of each block, which has the high device density, without varying the area of the block, and reducing, when the blocks, which have the high device density, are determined to concentrate in a specific column, the vertical dimension of each block, which has the high device density, without varying the area of the block.

11. The method for compressing a semiconductor integrated circuit according to claim 1, wherein a compression ratio of the block is determined in accordance with a required shape of an entire design.

12. The method for compressing a semiconductor integrated circuit according to claim 11, wherein an aspect ratio of the block is changed in accordance with a required shape of an entire design.

13. A method for compressing a semiconductor integrated circuit, comprising:
    dividing a design region, in which a semiconductor integrated circuit is designed and semiconductor devices are assigned, into a plurality of blocks;
    determining a device density of each block;
    compressing any block that is determined to have a low device density;
    connecting the blocks by wiring;
    wherein the compressing of the block includes overlapping adjacent blocks with the low device density and overlapping a block with the low device density and a block with a high device density, which are located adjacent to each other.

14. The method for compressing a semiconductor integrated circuit according to claim 13, wherein the size of each of the divided blocks is set such that when the positions of the semiconductor devices are shifted within the block, a wiring delay due to the shift does not affect an operation of the semiconductor integrated circuit.

15. The method for compressing a semiconductor integrated circuit according to claim 14, wherein a time of the wiring delay, which varies when the positions of the semiconductor devices are shifted within each block, is 1% or less of an operational clock cycle of the semiconductor integrated circuit.

16. The method for compressing a semiconductor integrated circuit according to claim 13, further comprising:
   determining a wiring density in the block, which is determined to have the low device density, prior to the compressing of the block; and
   determining any block found to have a wiring density equal to or higher than a predetermined value, to be one that has a high device density.

17. The method for compressing a semiconductor integrated circuit according to claim 13, further comprising:
   determining, prior to the compressing of the block, whether the blocks, which are determined to be "dense", concentrate in a specific row or column; and
   reducing, when the blocks, which have the high device density, are determined to concentrate in a specific row, the horizontal dimension of each block, which has the high device density, without varying the area of the block, and reducing, when the blocks, which have the high device density, are determined to concentrate in a specific column, the vertical dimension of each block, which has the high device density, without varying the area of the block.

18. The method for compressing a semiconductor integrated circuit according to claim 13, wherein a compression ratio of the block is determined in accordance with a required shape of an entire design.

19. The method for compressing a semiconductor integrated circuit according to claim 18, wherein an aspect ratio of the block is changed in accordance with a required shape of an entire design.

* * * * *